(12) United States Patent
Yashiki et al.

(10) Patent No.: US 9,577,407 B2
(45) Date of Patent: Feb. 21, 2017

(54) OPTICAL TRANSMITTER OR TRANSMISSION UNIT IN OPTICAL TRANSMITTER/RECEIVER PROVIDED ON OPTO-ELECTRIC HYBRID BOARD

(71) Applicant: Photonics Electronics Technology Research Association, Tokyo (JP)

(72) Inventors: Kenichiro Yashiki, Tokyo (JP); Kazuhiko Kurata, Tokyo (JP)

(73) Assignee: PHOTONICS ELECTRONICS TECHNOLOGY RESEARCH ASSOCIATION, Tokyo (JP)

( * ) Notice: Subject to any disclaimer, the term of this patent is extended or adjusted under 35 U.S.C. 154(b) by 0 days.

(21) Appl. No.: 14/906,880

(22) PCT Filed: Jul. 18, 2014

(86) PCT No.: PCT/JP2014/069164
§ 371 (c)(1),
(2) Date: Jan. 21, 2016

(87) PCT Pub. No.: WO2015/012213
PCT Pub. Date: Jan. 29, 2015

(65) Prior Publication Data
US 2016/0164251 A1 Jun. 9, 2016

(30) Foreign Application Priority Data
Jul. 22, 2013 (JP) .................. 2013-151491

(51) Int. Cl.
*G02B 6/28* (2006.01)
*H01S 5/026* (2006.01)
(Continued)

(52) U.S. Cl.
CPC ......... *H01S 5/0268* (2013.01); *G02B 6/12004* (2013.01); *G02B 6/125* (2013.01);
(Continued)

(58) Field of Classification Search
CPC ....... G02B 6/34; G02B 6/4204; G02B 6/4249; G02B 6/2813; G02B 6/12004; G02B 6/125; H01S 5/0268; H01S 5/005; H01S 5/0085; H01S 5/02248
(Continued)

(56) References Cited

U.S. PATENT DOCUMENTS 5,111,323 A * 5/1992 Tanaka .................... H03M 9/00
 398/100
7,303,340 B2 * 12/2007 Hubner ................ G02B 6/4201
 385/88

(Continued)

FOREIGN PATENT DOCUMENTS

JP 2005-266623 A 9/2005
WO WO-2007-013128 A1 2/2007

OTHER PUBLICATIONS

Yutaka Urino et al., "Demonstration of 12.5-Gbps optical interconnects integrated with lasers, optical splitters, optical modulators, and photodetectors on single silicon substrate", Optics Express, vol. 20, Issue 26 (https://www.osapublishing.org/oe/fulltext.cfm?uri=oe-20-26-B256&id=246439), Dec. 10, 2012, pp. B256-B263 (8 sheets), Optical Society of America, USA.

(Continued)

*Primary Examiner* — Akm Enayet Ullah
(74) *Attorney, Agent, or Firm* — Michael Best & Friedrich LLP

(57) ABSTRACT

This present invention is provided with: a semiconductor laser for emitting laser light in a plurality of channels; optical waveguides optically coupled in a corresponding manner to the semiconductor lasers, the optical waveguides propagating laser light as input light for each channel; optical modulators for modulating the input light and generating an optical signal; and an optical signal output unit coupled to the optical modulators, the optical signal output
(Continued)

unit outputting the optical signal propagated from the optical modulators to the exterior. The present invention is characterized in that the semiconductor laser is arranged on the opposite side from an optical branching unit and the optical modulators, with the optical signal output unit interposed therebetween, in the plane of an opto-electric hybrid board.

6 Claims, 12 Drawing Sheets

(51) Int. Cl.
    *G02B 6/42*         (2006.01)
    *H01S 5/022*       (2006.01)
    *G02B 6/125*       (2006.01)
    *G02F 1/025*       (2006.01)
    *G02B 6/34*         (2006.01)
    *G02B 6/12*         (2006.01)
    *H01S 5/00*         (2006.01)

(52) U.S. Cl.
    CPC ......... *G02B 6/4204* (2013.01); *G02B 6/4249* (2013.01); *G02F 1/025* (2013.01); *H01S 5/0085* (2013.01); *H01S 5/02248* (2013.01); *G02B 6/2813* (2013.01); *G02B 6/34* (2013.01); *G02B 2006/12142* (2013.01); *H01S 5/005* (2013.01)

(58) Field of Classification Search
    USPC .. 385/2, 14, 24, 28, 37; 398/140; 372/44.01, 372/45.01, 50.11, 50.124
    See application file for complete search history.

(56) References Cited

U.S. PATENT DOCUMENTS

| 2004/0033008 | A1* | 2/2004 | Mikawa | G02B 6/43 |
| | | | | 385/14 |
| 2008/0118202 | A1 | 5/2008 | Kato et al. | |
| 2009/0028201 | A1* | 1/2009 | Tsuji | B82Y 20/00 |
| | | | | 372/44.01 |
| 2011/0064354 | A1* | 3/2011 | Nishio | G02B 6/4214 |
| | | | | 385/14 |
| 2012/0219251 | A1* | 8/2012 | Kuroda | G02B 6/122 |
| | | | | 385/14 |

OTHER PUBLICATIONS

Yasuhiko Arakawa et al., "Silicon Photonics for Next Generation System Integration Platform", IEEE Communications Magazine, Mar. 2013, vol. 51, Issue 3, pp. 72-77 (6 sheets), IEEE, USA.
International Search Report issued in Application No. PCT/JP2014/069164, mailed Oct. 14, 2014.

* cited by examiner

OPTICAL TRANSMITTER OR TRANSMISSION UNIT IN OPTICAL TRANSMITTER/RECEIVER PROVIDED ON OPTO-ELECTRIC HYBRID BOARD

TECHNICAL FIELD

The present invention relates to an optical transmitter or a transmission unit in an optical transmitter/receiver provided on an opto-electric hybrid board, and, more specifically, the present invention relates to an optical integrated circuit, that is characterized in placement of a semiconductor laser and arrangement of optical waveguides, in the optical transmitter or the transmission unit in the optical transmitter/receiver.

BACKGROUND ART

Recently, problems such as signal delay due to electric wiring, generation of heat, generation of EMI (electromagnetic radiation noise), and so on have been surfaced in the connection between electronic devices such as boards, computers, peripheral devices, and so on. For solving such problems arising in electric wiring, optical interconnection, that is constructed by use of a silicon photonics technique, is being developed (Non-patent-related Document 1). The silicon photonics is a technique relating to optical elements, and it uses silicon as material; and the optical interconnection is a technique for communicating signals by converting electric signals from an external device into optical signals and converting optical signals into electric signals. In Non-patent-related Document 1, an example of signal transmission between LSI chips is shown; however, transmission of converted signals between devices, in which the transmission is carried out by use of fibers via optical connectors, is also possible.

Regarding such optical interconnection in an opto-electric hybrid board, it is required to construct the opto-electric hybrid board in such a manner that the construction of connection for inputting/outputting electric signals and the construction of connection for inputting/outputting optical signals do not interfere with each other; and it is also required that the opto-electric hybrid board has a structure that makes possible to carry out electrical connection in a simple manner, and has a construction that makes possible to carry out precise and simple optical connection in a simple manner by simplifying the construction of optical connection.

FIGS. 1 and 2 are schematic top views that show prior-art optical integrated circuits for optical transmitters placed on opto-electric hybrid boards. In FIG. 1, arrangement of typical optical elements such as optical waveguide elements and so on is shown. On the other hand, in FIG. 2, optical waveguide elements and so on are not shown; however, instead thereof, arrangement of circuit elements such as input pads (electrically conductive pins in this example) for high-speed electric signals, a driver IC, and so on is shown. This type of optical integrated circuit can be downsized and made to be highly dense by forming it within a silicon substrate by using the silicon photonics technique.

In an optical integrated circuit 100 in FIG. 1, the laser light, that is emitted by a semiconductor laser 1 and inputted via optical coupling, propagates through an optical waveguide 3 via a spot size converter 2; and the laser light is coupled to a coupler (an MMI coupler) 4. In the optical coupler 4, the laser light is divided into plural pieces of input light, and the pieces of the input light propagate through optical waveguides 5a that are constructed as curved waveguides having curved parts 5a; and the pieces of the input light are inputted to an optical modulator array 60 in which plural optical modulators are arranged. The optical signals outputted from the optical modulator array 60 are coupled, via optical waveguides 7, to an optical signal outputting element array 80 in which plural optical signal outputting elements are arranged; and the optical signals are outputted from the optical signal outputting elements to the outside via optical fibers and so on.

As shown in FIG. 2, in an opto-electric hybrid board, an electric I/O array 90 that is formed by arranging, along fringe parts of the board, plural input pads for electrical connection for high-speed electric signals, and a driver IC 50 for controlling optical modulation are placed; and electrical connecting wires 95 of high-speed electric wiring are further formed on the opto-electric hybrid board. On the opto-electric hybrid board, the area for placing the driver IC 50 overlaps with the area of the optical modulator array 60; the driver IC is placed above the optical modulator; and the direction of propagation of the light within the optical modulator and the direction of propagation of the electric signal within the driver IC coincide with each other. Thus, the laser 1 is placed in such a manner that it avoids the electric I/O array 90 and the electrical connecting wires (in this example, it is placed on a corner part of the plane).

Although the above is shown as an example of an optical integrated circuit for an optical transmitter, an example of a transmission unit in an optical transmitted/received is similar to that described above.

CITATION LIST

Non-Patent-Related Documents

Non-patent-related Document 1: "Demonstration of 12.5-Gbps optical interconnects integrated with lasers, optical splitters, optical modulators and photodetectors on a single silicon substrate," OPTICS EXPRESS, Vol. 20, No. 26 (2012 Dec. 10) B256-B263

SUMMARY OF INVENTION

Technical Problem

As explained above, in the prior-art optical integrated circuit provided on the opto-electric hybrid board, the placement of the semiconductor laser 1 is determined in such a manner that the semiconductor laser 1 is placed to avoid the electric I/O array 90 and the electrical connecting wires (it is placed on a corner part of the plane in each of FIGS. 1 and 2). Thus, in the case that the number of channels is increased for the purposes of further downsizing and densification, arrangement of electric wiring will become difficult. Further, since the semiconductor laser is to be avoided when electric wiring is carried out, it may be necessary to bend an electric wiring line to have a bend angle of 90 degrees or more with respect to the propagation direction of electricity within the driver IC; so that deterioration of an electric signal cannot be avoided, as the speed of a signal for each channel increases. Still further, in the case that the semiconductor laser is placed on the corner part of the plane on the opto-electric hybrid board, and coupled to the optical modulator by use of the optical wave guide with the shortest distance therebetween, there is a problem such that, regarding the optical waveguides 5 arranged between the semiconductor laser 1 and the optical modulator array 60, their line lengths are largely different between respective channels.

In general, input light attenuates due to the length of an optical wave guide. Especially, in a multi-channel operation, if the degrees of intensity of pieces of input light at a receiving side are different for respective channels, crosstalk is likely generated due to differences of amplification ratios for respective channels in the receiver. Thus, it is not preferable to use optical waveguides having different lengths for respective channels.

Solution to Problem

For solving the above problems, the present invention provides an optical transmitter or a transmission unit in an optical transmitter/receiver that comprises an optical integrated circuit that is characterized in placement of a single-channel or multi-channel semiconductor laser and arrangement of optical waveguides.

An optical transmitter or a transmission unit in an optical transmitter/receiver provided on an opto-electric hybrid board comprises a semiconductor laser for emitting laser light by use of plural channels; optical waveguides, coupled respectively and optically to the semiconductor laser, for allowing pieces of the laser light for the respective channels to propagate through the optical waveguides as pieces of input light; optical modulators for generating optical signals by modulating the pieces of input light; and optical signal outputting parts, respectively coupled to the optical modulators, for outputting the optical signals propagated through the optical modulators to the outside. It is characterized in that, on a plane of the opto-electric hybrid board, the semiconductor laser is placed on a side of the optical signal outputting parts opposite to another side of the optical signal outputting parts where the optical modulators are placed.

Also, the optical transmitter or the transmission unit in the optical transmitter/receiver provided on the opto-electric hybrid board of the present invention comprises optical branching units, wherein each of the optical branching units divides the laser light into two or more pieces of input light, and the modulators are respectively coupled to two or more optical output terminals provided to the optical branching unit.

In the optical transmitter or the transmission unit in the optical transmitter/receiver provided on the opto-electric hybrid board of the present invention, each of the optical signal outputting parts comprises a grating coupler for diffracting the propagated optical signal, and an optical pin optically coupled to the grating coupler and installed to stand with a desired angle with respect to a plane of the opto-electric hybrid board for outputting the optical signal to the outside.

Further, in the optical transmitter or the transmission unit in the optical transmitter/receiver provided on the opto-electric hybrid board of the present invention, the semiconductor laser comprises m channels (m is an integer that is equal to or more than 1), the optical waveguides comprise first to m-th optical waveguides, the optical branching units comprise first to m-th optical branching units, each of the first to m-th optical branching units divides the laser light into n pieces of input light (n is any integer that is equal to or more than 2), the n pieces of input light are coupled via the optical output terminals to first to n-th optical modulators, a k-th optical waveguide (k is any integer that is equal to 1 or m, or between 1 and m) is coupled to a k-th optical branching unit through a space between an n-th optical modulator coupled to a (k−1)th optical branching unit and a first optical modulator coupled to the k-th optical branching unit, or a space between an n-th optical modulator coupled to the k-th optical branching unit and a first optical modulator coupled to a (k+1)th optical branching unit, for making the connection length of each of the plural optical waveguides to be equal.

Advantageous Effects of Invention

According to the basic construction of the present invention, in the optical transmitter or the transmission unit in the optical transmitter/receiver provided on the opto-electric hybrid board, the semiconductor laser is placed on an output side of the optical modulators, i.e., it is placed near the optical signal outputting parts, in the optical integrated circuit; so that electric wire connection of electrical signal wiring lines, that is highly dependent on frequencies, can be carried out more effectively and freely. Thus, load on the electric wiring for high-speed/high-frequency use can be reduced. Further, by having an optical pin as an optical interface, deterioration of the above explained electrical wiring can be suppressed, and low-loss coupling to an external waveguide such as a fiber or the like can be carried out without having effect due to placement of the semiconductor laser and/or the driver IC. By guiding the light from the semiconductor laser to the optical modulators by use of optical waveguides that are placed in spaces between optical modulators, and by making the connection length of each of the plural optical waveguides to be equal the optical waveguides to be isometric, the wiring length can be reduced, uniformity of optical losses can be realized, crosstalk in the receiver side can be suppressed, and optical interconnection having good signal quality can be realized, when compared with the case that wiring is carried out to avoid the driver IC and/or the whole of optical modulators.

As a result, the present invention can realize an optical transmitter or a transmission unit in an optical transmitter/receiver having good high-frequency characteristics.

DESCRIPTION OF EMBODIMENTS

In the following, an optical transmitter or a transmission unit in an optical transmitter/receiver provided on an opto-electric hybrid board according to each of embodiments of the present invention will be explained in detail with reference to the figures. Note that, although an optical transmitter is considered mainly as the basis of explanation, the explanation also applies to a transmission unit in an optical transmitter/receiver. Also, similar reference symbols are assigned to similar components.

Figure 2:
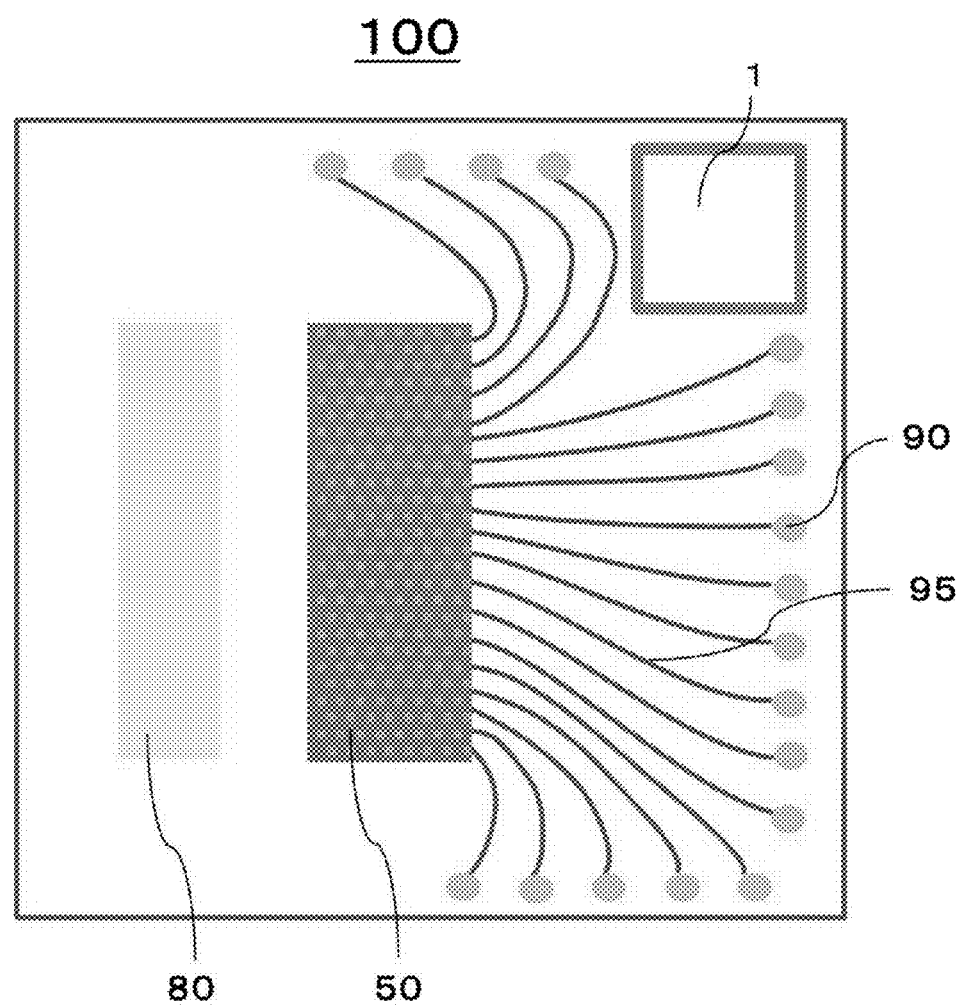
FIG. 2 is a schematic plain view showing a prior-art optical integrated circuit for an optical transmitter.
Figure 3:
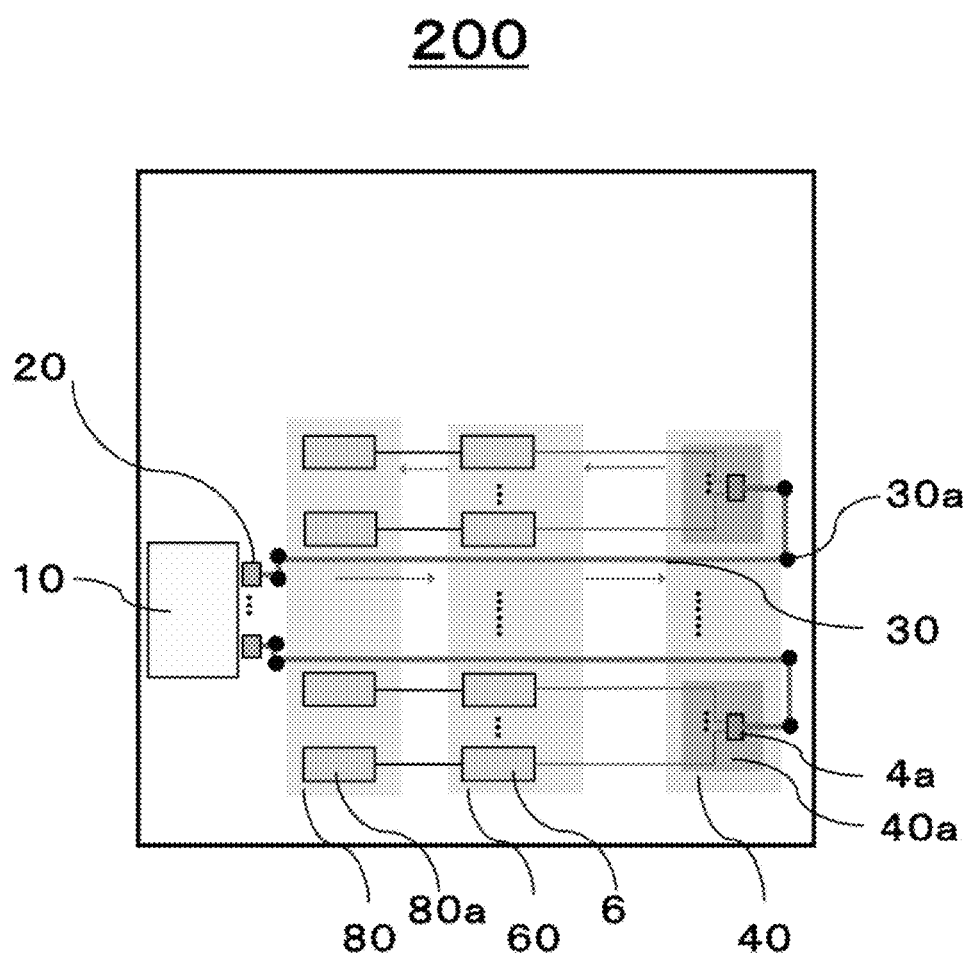
FIG. 3 is a schematic plain view of showing optical integrated circuit for an optical transmitter (or a transmission unit in an optical transmitter/receiver) according to an embodiment of the present invention.
Figure 4:
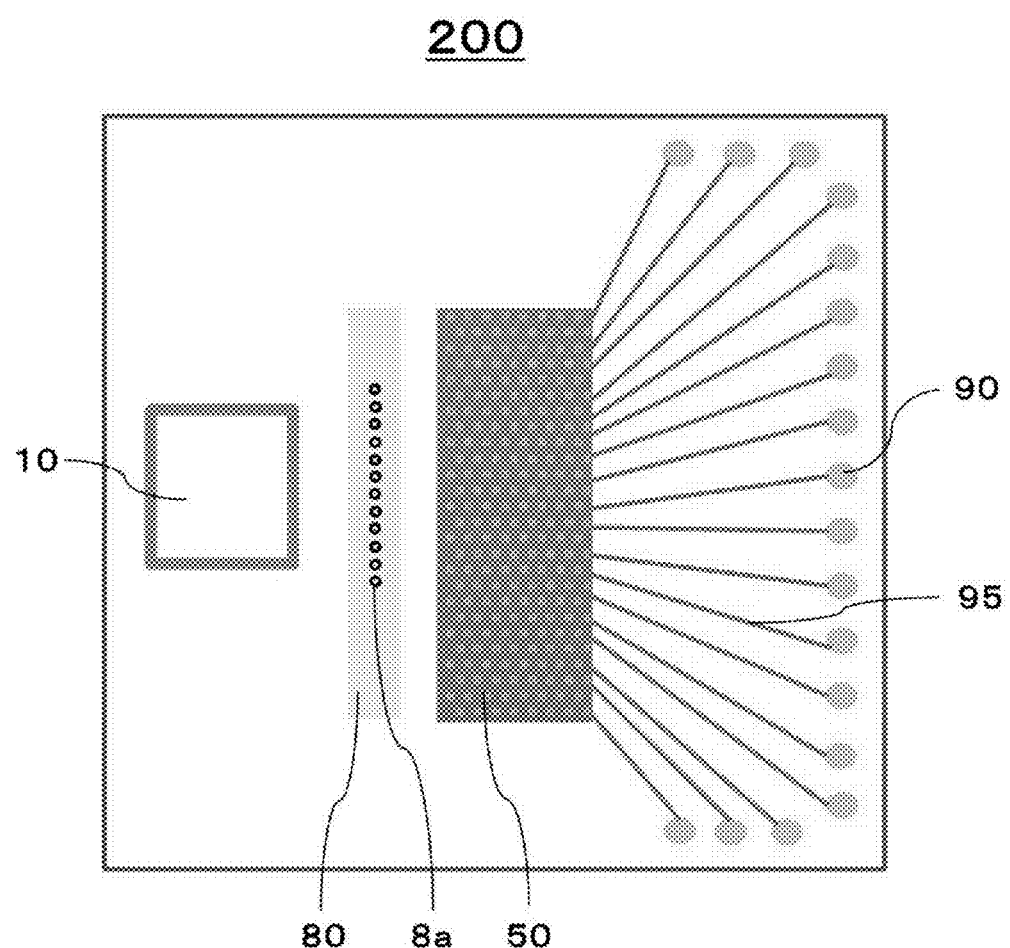
FIG. 4 is a schematic plain view showing an optical integrated circuit for an optical transmitter (or a transmission unit in an optical transmitter/receiver) according to an embodiment of the present invention.
Figure 5:
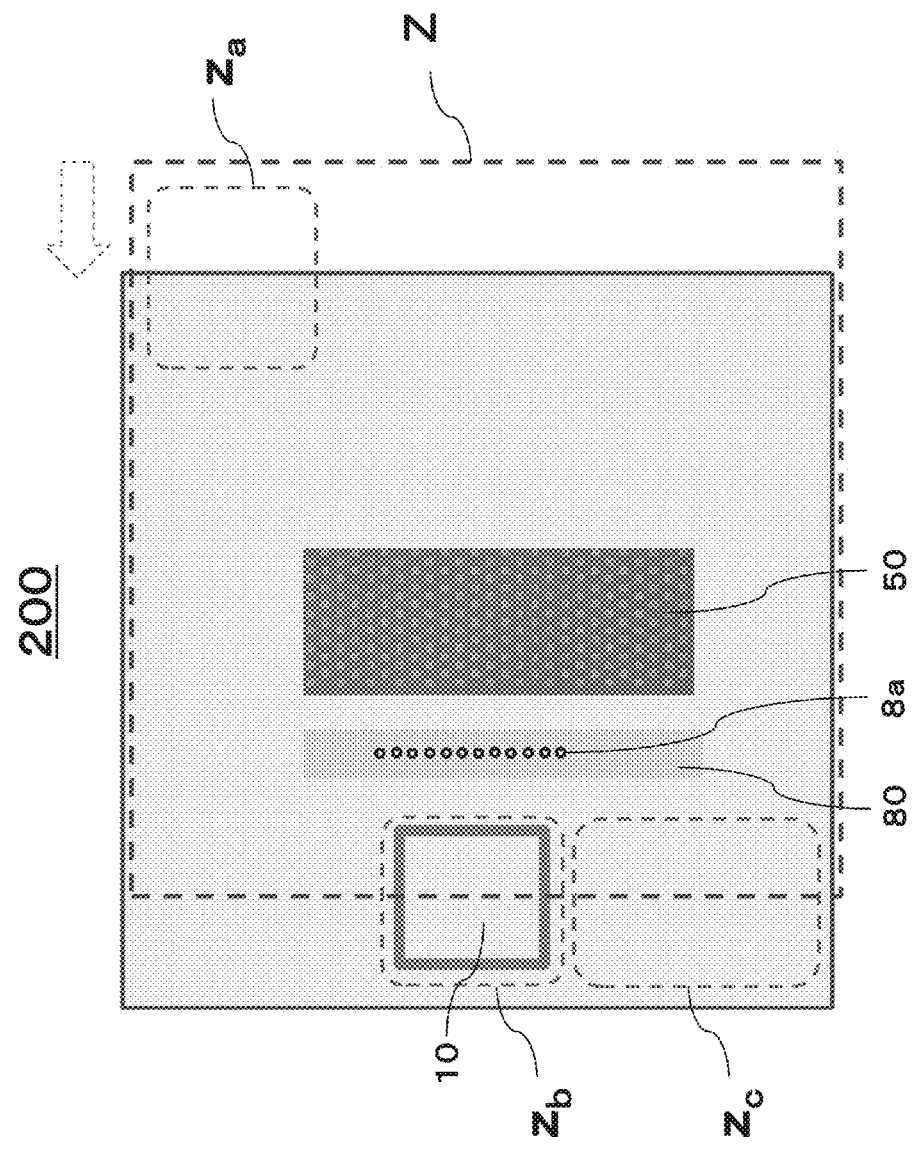
FIG. 5 is a schematic plain view showing an optical integrated circuit for an optical transmitter (or a transmission unit in an optical transmitter/receiver) according to an embodiment of the present invention.

Each of FIGS. 3-5 is a schematic plain view showing an optical integrated circuit 200 for an optical transmitter provided on an opto-electric hybrid board, according to an embodiment of the present invention. FIG. 3 shows an aspect of arrangement of optical elements; and this figure corresponds to FIG. 1 that shows a prior-art construction. On the other hand, FIG. 4 does not show optical waveguide elements and so on; however, instead thereof, it shows arrangement of circuit elements such as input pads (electrically conductive pins in this example) for high-speed electric signals, a driver IC, and so on. FIG. 4 corresponds to FIG. 2 that shows a prior-art construction.

As shown in FIG. 3, the optical integrated circuit 200 for an optical transmitter according to an embodiment of the present invention comprises: a single-channel or multi-channel semiconductor laser 10 for emitting laser light by use of one or more channels; optical waveguides 30, that are coupled optically from the semiconductor laser 10 via spot size converters 20 for respective channels, for sending laser light to be propagated in a lateral direction mainly; optical branching parts 40a that are respectively coupled to the optical waveguides 30, and comprise optical couplers 4a for dividing the laser light into at least two pieces of input light; optical modulators 6, that are respectively coupled to two or more optical output terminals provided to the respective optical branching parts, for generating optical signals by modulating the pieces of input light; and optical signal outputting parts 80a, that are respectively coupled to the optical modulators 6, for outputting the optical signals propagated through the optical modulators to the outside.

The plural optical branching parts 40a comprising optical couplers 4a are aligned in a line in a longitudinal direction to thereby form an optical coupler array 40; the plural optical modulators 6 are aligned in a line in a longitudinal direction to thereby form an optical modulator array 60; and the plural optical signal outputting parts 80a are aligned in a line in a longitudinal direction to thereby form an optical signal outputting array 80.

In a plane of the opto-electric hybrid board 200, the semiconductor laser 10 is placed on a side of the optical signal outputting parts 80a (optical signal outputting array 80) opposite to another side of the optical signal outputting parts 80a where the optical modulators 6 (optical modulator array 60) are placed.

In this embodiment, although the optical branching parts 40a (optical coupler array 40) are placed on a side of the optical modulators 6 (optical modulator array 60) opposite to another side of the optical modulators 6 (optical modulator array 60) where the semiconductor laser 10 is placed, it is possible to place the optical branching parts 40a (optical coupler array 40) in a space between the semiconductor laser 10 and the optical signal outputting parts 80a (optical signal outputting array). Regarding the optical branching parts 40a (optical coupler array 40) and the electrical connecting wires 95 for high-speed signals, it should be noted that, since the electrical connecting wires 95 can be formed on the optical branching parts 40a (optical coupler array 40) and they do not interfere with each other, it is preferable to place the optical branching parts 40a (optical coupler array 40) on a side of the optical modulators 6 (optical modulator array 60) opposite to another side of the optical modulators 6 (optical modulator array 60) where the semiconductor laser 10 is placed; this is because the size of the area of the chip can be reduced and the area to be used for electrical wiring can be increased.

Figure 1:
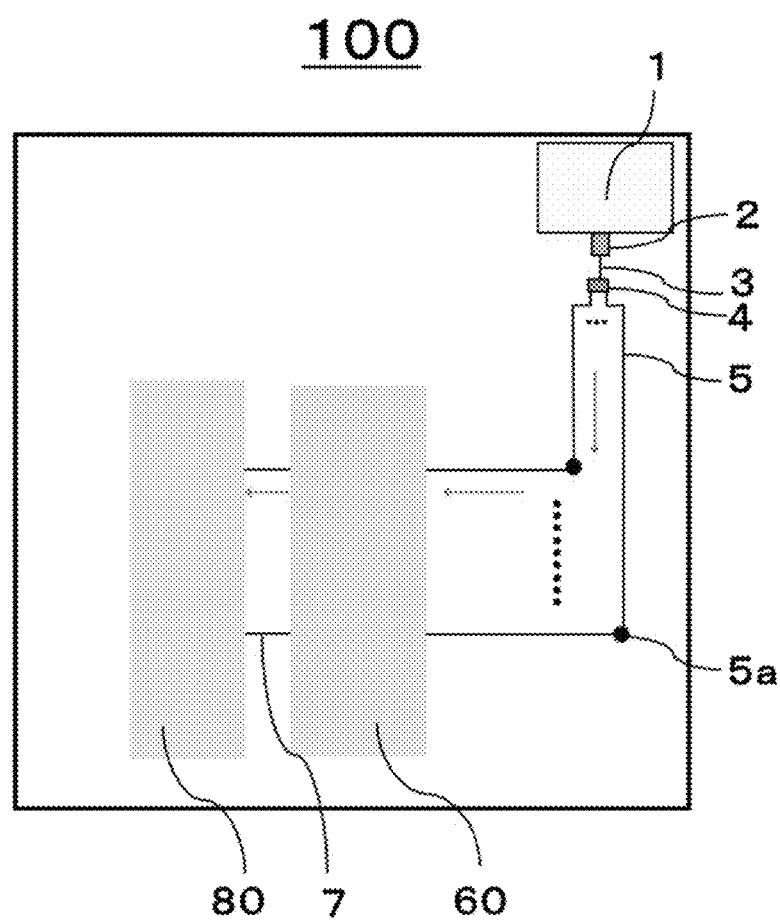
FIG. 1 is a schematic plain view showing a prior-art optical integrated circuit for an optical transmitter (or a transmission unit in an optical transmitter/receiver).

When compared with FIG. 1 that shows a prior-art construction, it can be found that the construction such that the semiconductor laser 10 is placed on an output side of the optical modulators 6 (optical modulator array 60), specifically, on the optical signal outputting array 80 side, is greatly different from the prior-art construction; and it can be found that the construction such that the optical waveguides 30 from the spot size converters 20 are connected to the optical branching parts 40a, that are placed on a side opposite to another side where the semiconductor laser 10 is placed, by placing the optical waveguides 30 in spaces between adjacent optical modulators 6 to extend laterally is also different from the prior-art construction. Note that, although the semiconductor laser 10 shown in the figure is a multi-channel semiconductor laser, the semiconductor laser to be used is not limited so; and a single-channel semiconductor laser such as that shown in FIG. 1 can be also used.

The placement of the semiconductor laser 10 on the opto-electric hybrid board will become more apparent after referring to FIGS. 4 and 5. Specifically, in the optical transmitter according to the present embodiment, the semiconductor laser 10 is placed on the optical signal outputting array 80 side that is located on the left side (not the electrical I/O array 90 side) in the optical integrated circuit. As a result, the semiconductor laser placing area (area Za shown by a dashed line in FIG. 5), that was required in the prior-art technique, can be reserved as a space that is to be used as an area for arranging input pads and an area for electrical connecting wires for high-speed electric wiring directed from the input pads to the driver IC 50, as shown in FIG. 4. Thus, electric connection of high-speed electric wiring lines can be carried out more freely by using the area wider than the area provided by the prior-art technique.

Further, in the aspect of the arrangement of elements shown in each of FIGS. 4 and 5, optical pins 8a are provided as the optical signal outputting parts 80a included in the optical transmitter according to the present embodiment. More specifically, each of the optical signal outputting parts 80a is constructed to comprise a grating coupler 8b for diffracting the optical signal propagated through the optical modulator 6, and an optical pin 8a optically coupled to the grating coupler 8b and installed to stand with a desired angle with respect to the plane of the opto-electric hybrid board for outputting the optical signal to the outside. By constructing the optical signal outputting part 80a as explained above, there will be an advantage such that the optical fiber array placing area (area Zb shown by a dashed line in FIG. 5), that was provided for connection with optical fibers and so on, can be reserved and used as a space for placing the semiconductor laser.

Further, when compared with the prior-art optical integrated circuit plane 100 shown in FIG. 1 (this area corresponds to area Z represented by dashed line in FIG. 5), it can be understood that, in the integrated circuit plane 200 for the optical transmitter according to the present embodiment shown in FIG. 5, by changing the semiconductor laser 10 placing area from the prior-art area (Za), it becomes possible to slightly shift the whole of the opto-electric hybrid board plane in a lateral direction with respect to the driver IC 50 and/or the optical signal outputting array 80 (the left arrow represented by a dashed line). As a result, a space that is newly set below the semiconductor laser 10 placing area (area Zc shown by a dashed line in FIG. 5) can be used as a new placing space for electric wiring. For example, it becomes possible to newly reserve and use it as a space for placing control pads (not shown) for inputting and/or outputting low-speed modulation control signals. Thus, it becomes possible to further separate a low-speed electric wiring area and a high-speed electric wiring area, so that it becomes possible to realize further effective electric signal wiring.

FIG. 3 will be referred to again. In the optical transmitter according to the present embodiment, the plural optical waveguides 30 are arranged in such a manner that each of them comprises a curved waveguide having a curved part 30a, and extends through a space between predetermined adjacent optical modulators, for making the length of each of the optical waveguides to be equal with each other (i.e., for realizing isometric). By arranging the optical waveguides 30 in such a manner, isometric of optical waveguides can be realized with shorter wiring length, compared with, for example, the case that the optical waveguides 30 are placed in a periphery of the optical modulator array 60 and the optical signal outputting array 80 for avoiding them. Note that, throughout the present invention, the optical waveguides are constructed to comprise longitudinal waveguides, lateral waveguides, and curved parts for bending the waveguides by 90 degrees.

Next, supplementary explanation of arrangement of optical waveguides between adjacent optical modulators will be provided. In general, the size of the optical modulator used in the optical integrated circuit with a scale of a 5 μm×5 μm, that is formed by use of the silicon photonics technique, is approximately 40 μm×250 μm, and the pitch between adjacent optical modulators is approximately 125 μm. In this regard, a blank space of approximately 85 μm exists between the adjacent optical modulators. If it is supposed that the core diameter of the optical waveguide is 3 μm, and a clad on each of both sides thereof is 1 μm, it is possible to place approximately 20 optical waveguides between the adjacent optical modulators.

As explained above, in the optical integrated circuit 200 in the optical transmitter of the present invention, by placing the semiconductor laser on the output side of the optical modulators, i.e., on a place near the optical signal outputting parts, and by contriving arrangement of optical waveguides, that are less dependent on frequencies, to achieve isometric, it becomes possible to carry out arrangement of high-speed electric wiring lines, that is highly dependent on frequencies, more effectively and freely, and reduce the load on the electric wiring.

Figure 6:
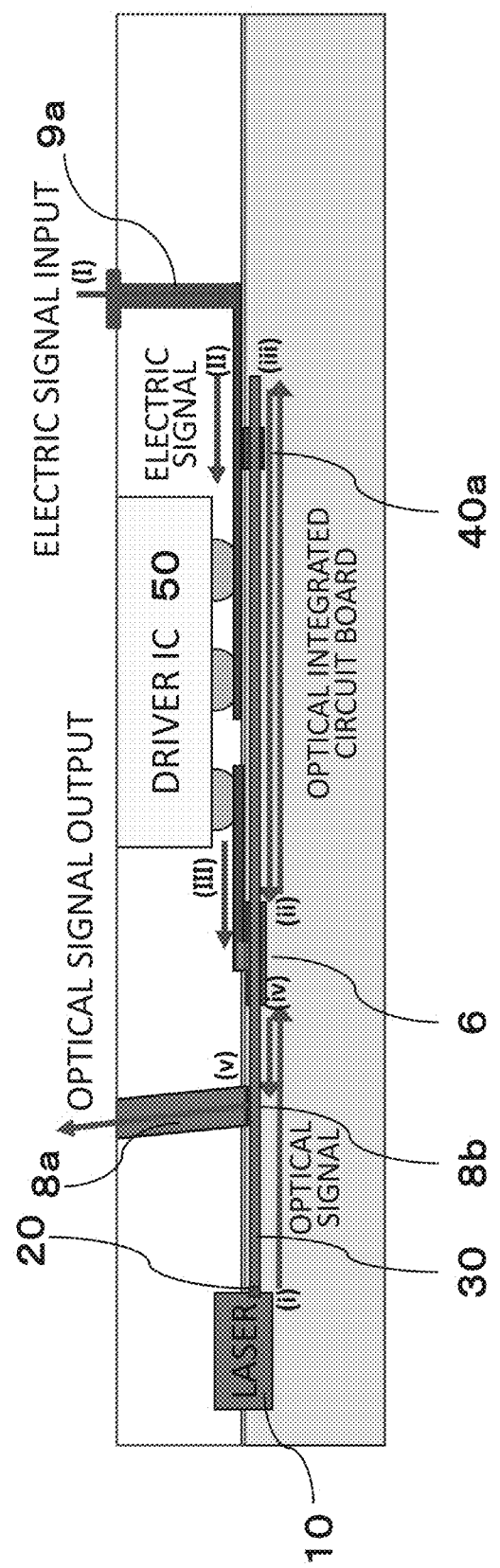
FIG. 6 is a cross-section view of an optical integrated circuit for an optical transmitter (or a transmission unit in an optical transmitter/receiver) according to an embodiment of the present invention.

FIG. 6 is a cross-section view of an optical integrated circuit for an optical transmitter according to an embodiment of the present invention. An aspect of an operation at the time of optical signal transmission will be explained with reference to FIG. 6. The laser light from the semiconductor laser 10 placed on the side of the optical outputting parts is inputted to the optical modulator 6 via the spot size converter 20, the optical waveguide 30, the optical branching part 40a on the side of the electrically conductive pin 9a, and so on ((i)-(iii)); and a modulated optical signal is outputted by the optical modulator 6 (iv). The modulated optical signal arrives at the grating coupler 8b via the optical waveguide, the optical axis is changed by diffraction by the grating coupler 8b, and the resultant optical signal is outputted to the outside via the optical pin 8a (v). Note that the electric signal inputted from the outside via the electrically conductive pin 9a is inputted to the driver IC for controlling the optical modulator 6 and the semiconductor laser 10 ((I)-(II)), and supplied as a modulation controlling signal (an electric signal) to the optical modulator 6 via the electric wiring (III).

In the following, with reference to FIG. 7, the arrangement of the respective optical elements, i.e., the arrangement of the semiconductor laser 10 placed on the side of the optical signal outputting array 80 and the optical couplers 4 (optical branching parts 40a) placed on the side of the electrical I/O array 90 (not shown in the drawing), for the optical transmitter according to an embodiment of the present invention will be further explained in detail. For convenience, the channel number of the m-channel semiconductor laser 10 is represented by the expression CH[k] (in this embodiment, it is supposed that a multi-channel semiconductor laser is used; and m is an integer that is equal to or more than 2, and k is any integer that is equal to 1 or m, or between 1 and m), and the optical waveguide and the optical coupler related to the CH[k] are represented by the expressions PATH[k] and MMI[k], respectively.

As shown in the figure, in the optical coupler array 40, the optical couplers MMI[k−1], MMI[k], and MMI[k+1] are aligned in a line in a longitudinal direction. The optical coupler MMI[k] divides the laser light into n pieces of input light (n is an integer that is equal to or more than 2), and couples the light via its output terminals to the n optical modulators, respectively. Note that, although the optical coupler MMI[k] comprises one stage in FIG. 7, the construction is not limited thereto. For example, as shown in FIGS. 8-11 that will be referred to later, it is possible to construct the optical branching unit 40a comprising the optical couplers 4a that are arranged in a multiple stage structure comprising two or more stages.

In addition, n optical modulators coupled to the optical coupler MMI[k] are represented by the expressions MOD[k][1]-MOD[k][n]. As shown in the figure, in the optical modulator array 60, the optical modulators MOD[k−1][1]-

MOD[k−1][n], MOD[k][1]-MOD[k][n], and MOD[k+1][1]-MOD[k+1][n] are aligned in a line in a longitudinal direction.

Figure 7:
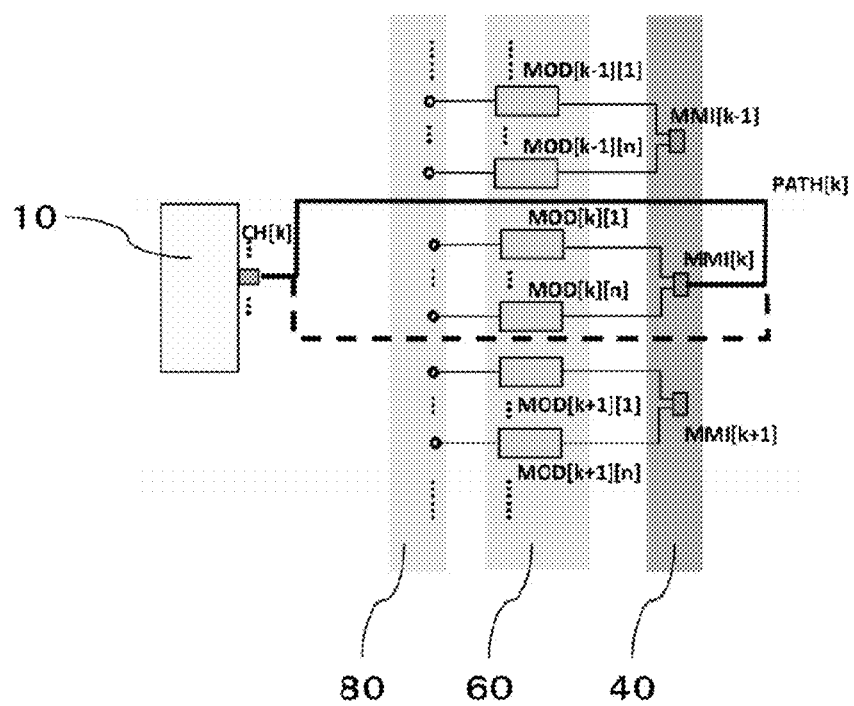
FIG. 7 is a schematic view for explaining an embodiment of arrangement of respective optical elements in an optical integrated circuit for an optical transmitter (or a transmission unit in an optical transmitter/receiver) according to an embodiment of the present invention.

As shown in FIG. 7, for realizing isometric, the optical waveguide PATH[k] arranged between specified adjacent optical modulators is placed in such a manner that it is arranged to couple to the optical coupler MMI[k] through one of the space between the optical modulator MOD[k−1][n] coupled to the optical coupler MMI[k−1] and the optical modulator MOD[k][1] coupled to the optical coupler MMI[k] (the solid line), and the space between the optical modulator MOD[k][n] coupled to the optical coupler MMI[k] and the optical modulator MOD[k+1][1] coupled to the optical coupler MMI[k+1] (the broken line).

Note that the top optical waveguide PATH[1] would be arranged in such a manner that it extends through the space between the optical modulator MOD[1][n] coupled to the optical coupler MMI[1] and the optical modulator MOD[2][1] coupled to the optical coupler MMI[2], and the bottom optical waveguide PATH[m] would be arranged in such a manner that it extends through the space between the optical modulator MOD[m][n] coupled to the optical coupler MMI[m−1] and the optical modulator MOD[m][1] coupled to the optical coupler MMI[m].

In the following, with reference to each of FIGS. 8-11, an example of arrangement of optical elements based on FIG. 7, in an integrated circuit for an optical transmitter according to each embodiment of the present invention, will be explained. Each of FIGS. 8-11 has 12-channel optical output, for example; that is, 12 pairs, each comprising a grating coupler (represented by the expression "GC" in the figure) and an optical pin (not shown in the drawing), are aligned. Similarly, 12 optical modulators (represented by the expression "MOD" in the figure) are also aligned. In these embodiment, FIG. 8 is an example using a 2-channel semiconductor laser, FIG. 9 is an example using a 3-channel semiconductor laser, and FIG. 10 is an example using a single-channel semiconductor laser.

Figure 8:
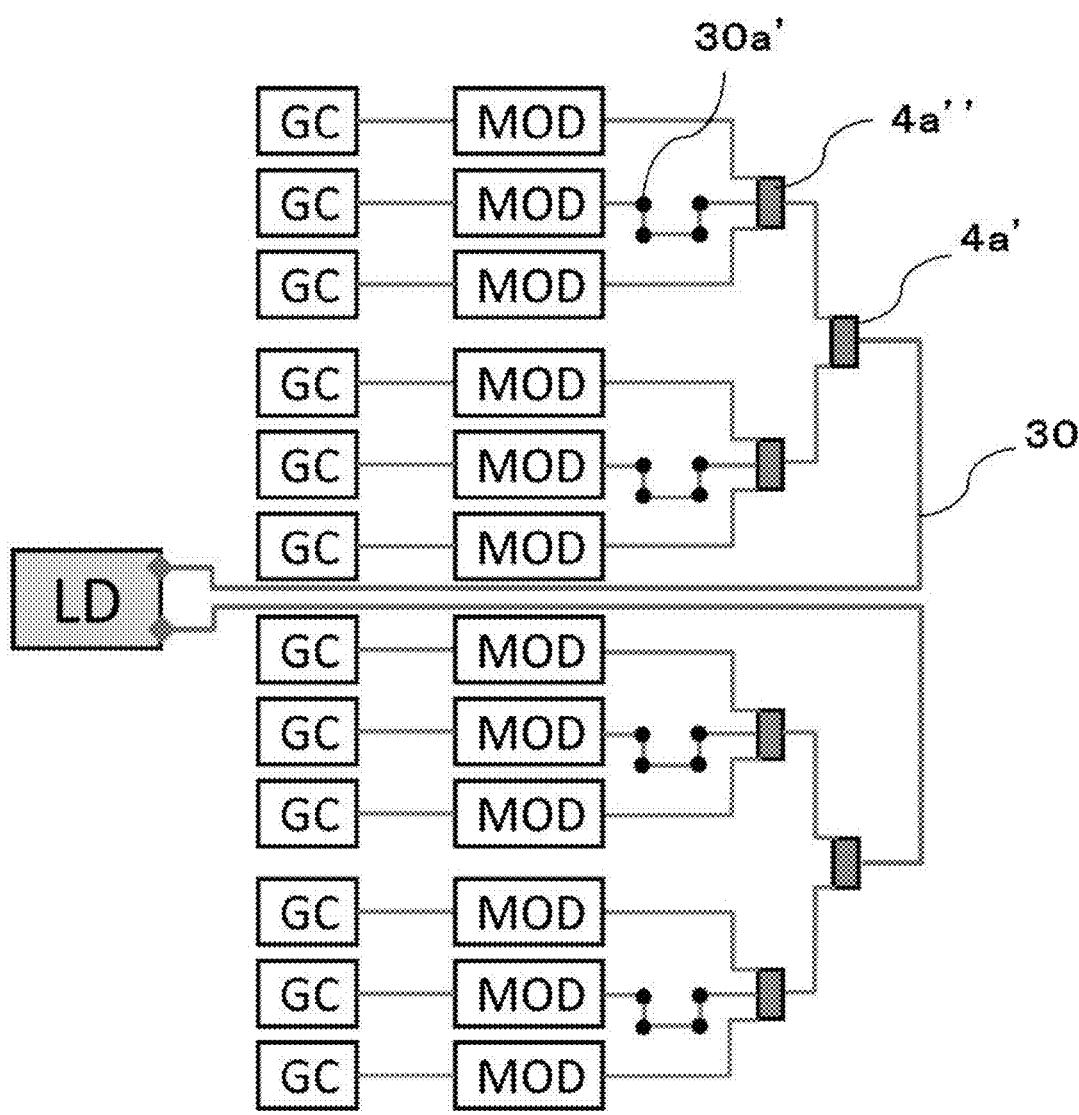
FIG. 8 shows an example of arrangement of optical elements, that is based on FIG. 7, in an optical integrated circuit for an optical transmitter (or a transmission unit in an optical transmitter/receiver) according to an embodiment of the present invention.

In FIG. 8, the optical output comprises 12 channels for the 2-channel semiconductor laser (LD); thus, the 12 optical modulators are divided into groups, each comprising 6 optical modulators; and two optical waveguides 30 are arranged between adjacent optical modulators between the groups, based on FIG. 7. Further, by constructing optical branching parts 40a to comprise two-stage arrangement comprising 2-branch-type optical couplers 4a' and 3-branch-type optical couplers 4a", the laser light outputted from each channel is divided into 6 pieces of input light.

Figure 9:
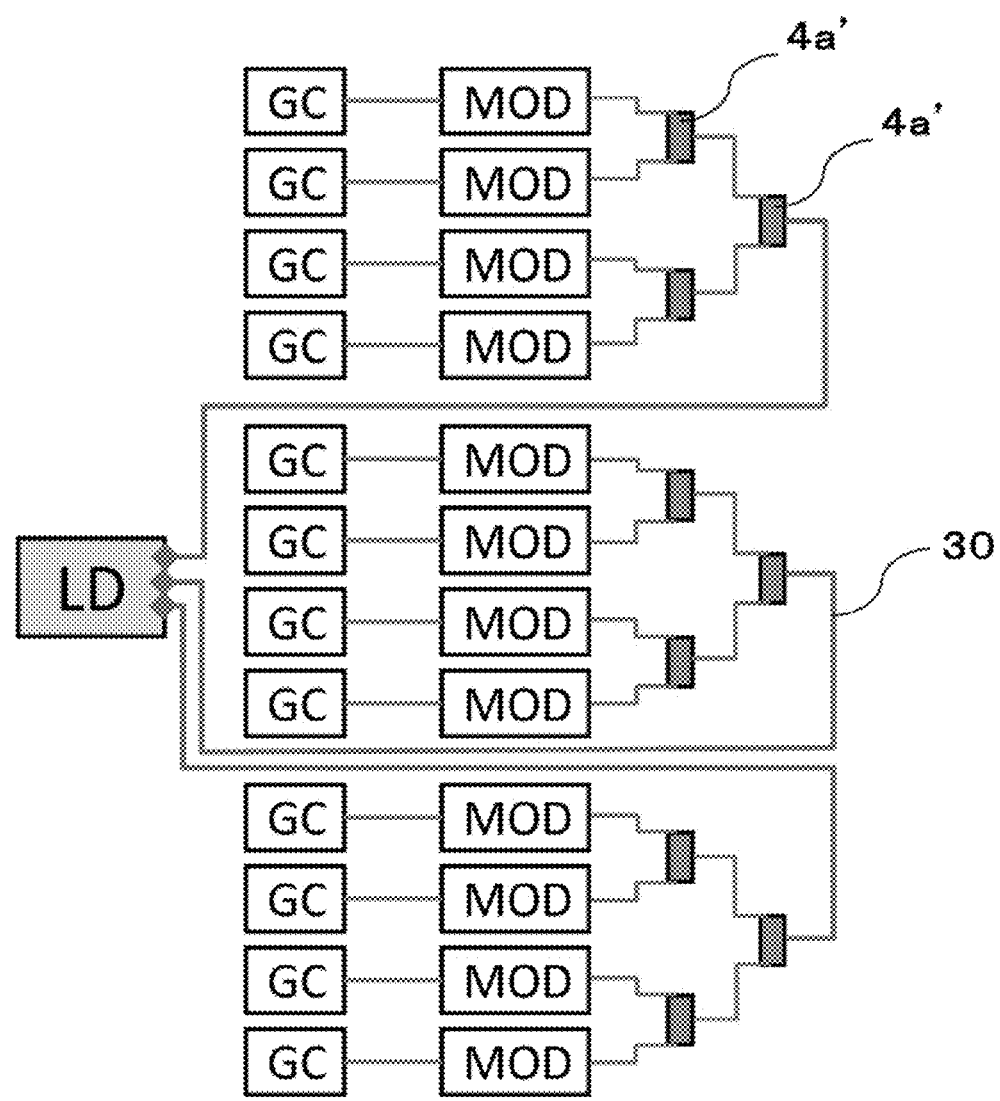
FIG. 9 shows an example of arrangement of optical elements, that is based on FIG. 7, in an optical integrated circuit for an optical transmitter (or a transmission unit in an optical transmitter/receiver) according to an embodiment of the present invention.
Figure 10:
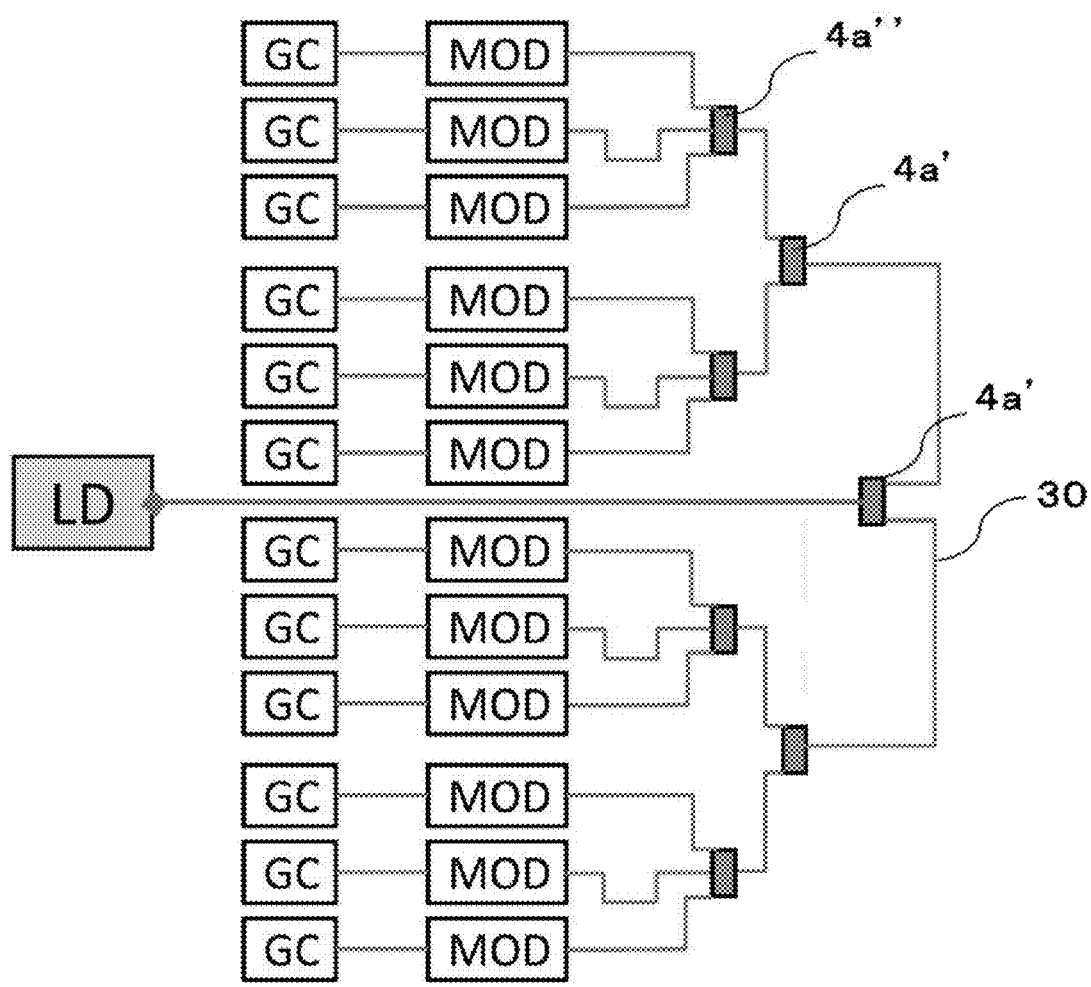
FIG. 10 shows an example of arrangement of optical elements, that is based on FIG. 7, in an optical integrated circuit for an optical transmitter (or a transmission unit in an optical transmitter/receiver) according to an embodiment of the present invention.

Similarly, in FIG. 9, the optical output comprises 12 channels for the 3-channel semiconductor laser (LD); thus, the 12 optical modulators are divided into groups, each comprising 4 optical modulators; and one optical waveguide 30 or two optical waveguides 30 is/are arranged between adjacent optical modulators between the groups, based on FIG. 7. Further, by constructing optical branching parts 40a to comprise two-stage arrangement comprising 2-branch-type optical couplers 4a', the laser light outputted from each channel is divided into 4 pieces of input light.

As would be understandable from FIGS. 8 and 9, for achieving isometric of optical waveguides between the optical branching parts 40a and the optical modulators 6, in addition to arranging the optical waveguides 30 between the semiconductor laser 10 and the optical branching parts 40a to achieve isometric thereof, it is desirable to construct each optical branching part 40a in such a manner that it comprises multi-stage arrangement comprising plural 2-branch-type or 3-branch-type optical couplers to divide the laser light into an arbitrary number of pieces of input light; however, the construction is not limited to the above, that is, single-stage arrangement comprising 4-branch optical couplers and so on may be used as long as isometric can be realized. Note that, in FIG. 8, for achieving isometric wiring of the optical waveguides between the 3-branch-type optical couplers and the optical modulators, the optical waveguides are appropriately devised to comprise curved parts 30a'; however, any types of arrangement of curved parts can be accepted as long as isometric of the optical waveguides can be realized.

Note that, in the case that the semiconductor laser is a single-channel-type semiconductor laser, it is constructed in such a manner that one optical waveguide 30 is placed in the center of the optical modulator array 60 (i.e., between the optical modulator groups, each being grouped to comprise 6 optical modulators), and that the optical branching part 40a comprises three-stage arrangement comprising 2-branch-type optical couplers and 3-branch-type optical couplers, as shown in FIG. 10. As a result, the waveguide length can be made to be shorter than that in the case that the optical waveguide 30 is arranged on the periphery of the optical modulator array 60.

Figure 11:
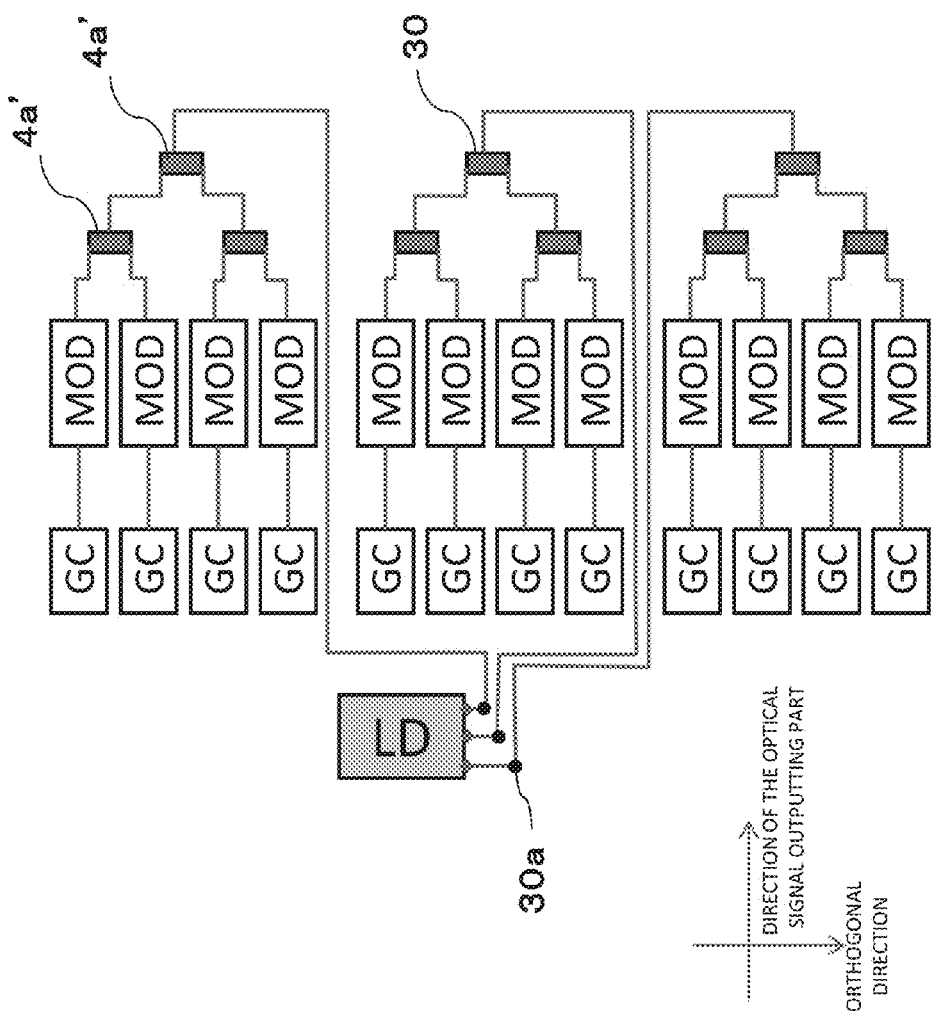
FIG. 11 shows an example of arrangement of optical elements, that is based on FIG. 7, in an optical integrated circuit for an optical transmitter (or a transmission unit in an optical transmitter/receiver) according to an embodiment of the present invention.

FIG. 11 shows a further modified example of arrangement of the optical elements shown in FIG. 9. Compared with FIG. 9, the direction of emission of laser light from the semiconductor laser (LD) is changed in FIG. 11. Specifically, the optical waveguide for each channel, that is arranged as a curved waveguide comprising a curved part 30a, extends from the spot size converter in a longitudinal direction, that is orthogonal to a lateral direction from the semiconductor laser 10 to the optical signal outputting array 80 (i.e., the direction to the optical signal outputting parts (GC)), and, at the curved part 3a positioned at a predetermined distance from the semiconductor laser 10, curves 90 degrees in a direction toward the optical signal outputting parts (i.e., the lateral direction). A reason to construct the optical elements as explained above is to prevent harmful influences on the optical integrated circuit and other elements and devices, due to stray light that is generated when end surfaces of the semiconductor laser and the spit size converter are coupled, confined within the clad, and reflected within the clad and thus guided to propagate therethrough. In this case, it is preferable to set the distance in relation to intensity of signal light. As an example, it is considered to set, as a predetermined distance, a distance that makes the intensity of the stray light relative to the optical signal propagating through the optical waveguide to be −30 dB.

Note that, although FIG. 11 is presented as a modified example of FIG. 9, explanations similar to those applied thereto also apply to other arrangement examples.

In each of the examples of arrangement of the elements shown in FIGS. 7-11, it is explained based on a precondition such that the optical branching parts 40a comprising the optical couplers 4a are formed in such a manner that they are aligned in a line in a longitudinal direction; however, it should be natural that a person skilled in the art admits that such optical branching parts 40a comprising the optical couplers 4a are not necessary components.

Figure 12:
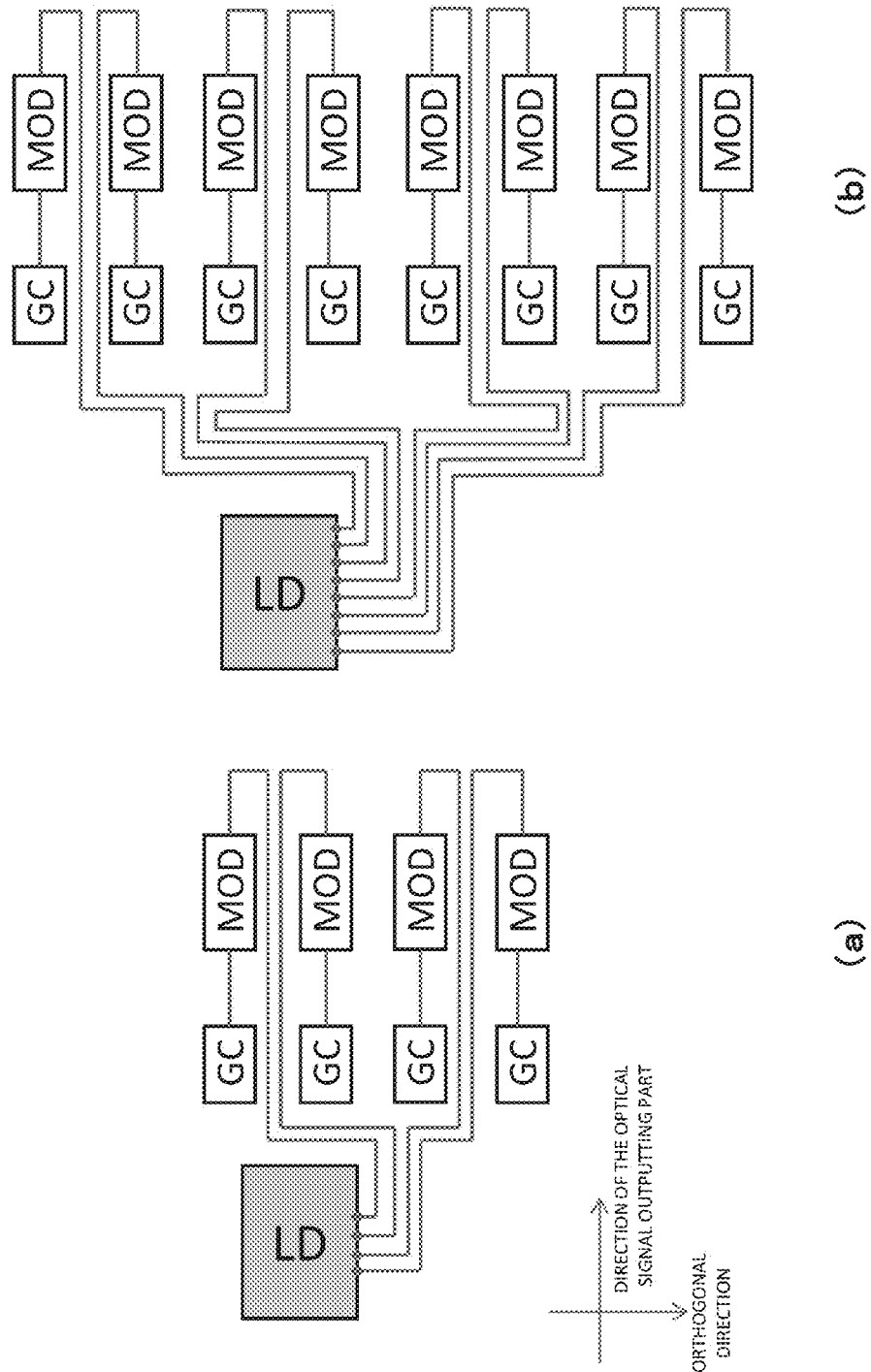
FIG. 12 shows an example of arrangement of optical elements for an optical transmitter (or a transmission unit in an optical transmitter/receiver) according to a different embodiment of the present invention.

More specifically, compared with FIG. 11, an aspect that does not have the construction relating to the optical branching parts 40a comprising the optical couplers 4a, such as each of examples of arrangement of elements shown in FIG. 12, is possible. The example of (a) in FIG. 12 depicts a case of 4 channels, and the example of (b) in FIG. 12 depicts a case of 8 channels. That is, it is possible to construct in such a manner that the optical waveguides are coupled respectively from the semiconductor laser to the optical modulators via the spot size converters, wherein the number of spot size converters is equal to that of the channels; and that the laser light (input light) is directly inputted to the optical modulators. In the case that plural channels exist and the number of the channels is a multiple of 2 as is the case with each of the arrangement examples shown in FIG. 12, it should be noted that it is possible to arrange the plural optical waveguides in such a manner that the respective wiring lengths of the plural optical waveguides, that are waveguides including curved parts, are made to be approximately equal with each other (i.e., isometric is to be realized), by considering two channels as a pair.

Further, regarding arrangement of optical waveguides, although it is needles to explain, it is possible to construct the whole of the arrangement by combining the aspect of the arrangement for the case that the optical branching part 40*a* is used such as the case shown in FIG. 11, and the aspect of the arrangement for the case that the optical branching part 40*a* is not used such as the case shown in FIG. 12.

In the above, the present invention has explained in detail with reference to the drawings; and a person skilled in the art would understand that other similar embodiments can be used, and that modification of an embodiment or addition of an embodiment can be carried out without departing from the present invention. Note that the present invention should not be limited to the above embodiments; and the present invention should be construed based on the descriptions of the claims.

REFERENCE SIGNS LIST

Optical integrated circuit 100, 200
Semiconductor laser 1, 10
Spot size converter 2, 20
Optical coupler 4, 4*a*, 4*a*', 4*a*"
Optical coupler array 40
Optical branching unit 40*a*
Optical waveguide 3, 5, 7, 30
Curved part 5*a*, 30*a*, 30*a*'
Optical modulator 6
Optical modulator array 60
Optical pin 8*a*
Grating coupler 8*b*
Optical signal outputting array 80
Optical output part 80*a*
Electrically conductive pin 9*a*
Electrical I/O array 90
Electrical connecting wire 95
Driver IC 50

The invention claimed is:

1. An optical transmitter or a transmission unit in an optical transmitter/receiver provided on an opto-electric hybrid board comprising:
a semiconductor laser for emitting laser light by use of plural channels; optical waveguides, coupled respectively and optically to the semiconductor laser, for allowing pieces of the laser light for the respective channels to propagate through the optical waveguides as pieces of input light; optical modulators for generating optical signals by modulating the pieces of input light; and optical signal outputting parts, respectively coupled to the optical modulators, for outputting the optical signals propagated through the optical modulators to the outside;
wherein the optical transmitter or the transmission unit in the optical transmitter/receiver characterized in that, on a plane of the opto-electric hybrid board, the semiconductor laser being placed on a side of the optical signal outputting parts opposite to another side of the optical signal outputting parts where the optical modulators are placed.

2. The optical transmitter or the transmission unit in the optical transmitter/receiver according to claim 1, wherein it is characterized in that each of the optical signal outputting parts comprises a grating coupler for diffracting the propagated optical signal, and an optical pin optically coupled to the grating coupler and installed to stand with a desired angle with respect to a plane of the opto-electric hybrid board for outputting the optical signal to the outside.

3. The optical transmitter or the transmission unit in the optical transmitter/receiver according to claim 1 further comprising optical branching units, wherein each of the optical branching units divides the laser light into two or more pieces of input light, and the modulators are respectively coupled to two or more optical output terminals provided to the optical branching unit.

4. The optical transmitter or the transmission unit in the optical transmitter/receiver according to claim 3, wherein it is characterized in that
the semiconductor laser comprises m channels (m is an integer that is equal to or more than 1), the optical waveguides comprise first to m-th optical waveguides, and the optical branching units comprise first to m-th optical branching units,
each of the first to m-th optical branching units divides the laser light into n pieces of input light (n is any integer that is equal to or more than 2), and the n pieces of input light are coupled via the optical output terminals to first to n-th optical modulators, and
a k-th optical waveguide (k is any integer that is equal to 1 or m, or between 1 and m) is coupled to a k-th optical branching unit through a space between an n-th optical modulator coupled to a (k−1)th optical branching unit and a first optical modulator coupled to the k-th optical branching unit, or a space between an n-th optical modulator coupled to the k-th optical branching unit and a first optical modulator coupled to a (k+1)th optical branching unit, for making the connection length of each of the plural optical waveguides to be equal.

5. The optical transmitter or the transmission unit in the optical transmitter/receiver according to claim 3, wherein it is characterized in that each of the optical branching units comprises plural two-branch optical couplers or plural three-branch optical couplers arranged in multiple stages for dividing the laser light into any number of pieces of input light.

6. The optical transmitter or the transmission unit in the optical transmitter/receiver according to claim 1, wherein it is characterized in that each of the optical waveguides is arranged as a curved waveguide having a curved part; and the optical waveguide extends from the semiconductor laser along a direction orthogonal to a linear direction toward the optical signal outputting parts corresponding to the optical waveguide and, at the curved part positioned at a predetermined distance from the semiconductor laser, curves 90 degrees in a linear direction toward the optical signal outputting parts.

* * * * *